US010827164B2

(12) United States Patent
Perreault et al.

(10) Patent No.: US 10,827,164 B2
(45) Date of Patent: Nov. 3, 2020

(54) ACTIVE LCD SHUTTERS FOR VIRTUAL AND AUGMENTED REALITY LOW PERSISTENCE

(71) Applicant: Google LLC, Mountain View, CA (US)

(72) Inventors: John D. Perreault, Mountain View, CA (US); Jonathan Huang, Mountain View, CA (US); Patrick Llull, Mountain View, CA (US); Adrian Wong, Mountain View, CA (US); Justin Legakis, Mountain View, CA (US)

(73) Assignee: Google LLC, Mountain View, CA (US)

(*) Notice: Subject to any disclaimer, the term of this patent is extended or adjusted under 35 U.S.C. 154(b) by 42 days.

(21) Appl. No.: 16/144,025

(22) Filed: Sep. 27, 2018

(65) Prior Publication Data

US 2019/0273911 A1    Sep. 5, 2019

Related U.S. Application Data

(60) Provisional application No. 62/636,892, filed on Mar. 1, 2018.

(51) Int. Cl.
*H04N 13/332*    (2018.01)
*H01L 27/32*    (2006.01)
*H04N 13/167*    (2018.01)
*G02B 27/01*    (2006.01)

(52) U.S. Cl.
CPC ....... *H04N 13/332* (2018.05); *G02B 27/0172* (2013.01); *H01L 27/3227* (2013.01); *H04N 13/167* (2018.05)

(58) Field of Classification Search
CPC ............. G02B 27/0172; H04N 13/332; H04N 13/167; H01L 27/3227
See application file for complete search history.

(56) References Cited

U.S. PATENT DOCUMENTS 9,651,786 B1 *  5/2017  Browne .................. G09G 3/02
10,205,934 B2    2/2019  Jung
(Continued)

FOREIGN PATENT DOCUMENTS

WO       2016081697 A1    5/2016

OTHER PUBLICATIONS

International Search Report and Written Opinion dated May 24, 2019 for corresponding International Application No. PCT/US2019/018168, 12 pages.

(Continued)

*Primary Examiner* — Muhammad N Edun (57) ABSTRACT

A head-mounted display (HMD) device includes one or more active shutters coupled to a synchronization module. The synchronization module includes a first photodiode configured to detect a synchronization signal for controlling operation of the one or more active shutters. The one or more active shutters are configured to alternate between an open state to pass light and a closed state to block light for reducing a duty cycle of a display screen of a mobile device positioned within the HMD device. The synchronization signal provides a timing to block light from the display screen for a display update duration corresponding to a subset of pixels of the display screen.

18 Claims, 5 Drawing Sheets

(56) References Cited

U.S. PATENT DOCUMENTS

| | | | |
|---|---|---|---|
| 2001/0028413 A1* | 10/2001 | Tropper | G02B 30/24 |
| | | | 349/16 |
| 2011/0037837 A1* | 2/2011 | Chiba | H04N 13/341 |
| | | | 348/53 |
| 2011/0187839 A1* | 8/2011 | Price | H04N 13/30 |
| | | | 348/53 |
| 2016/0011423 A1 | 1/2016 | Thurber et al. | |
| 2016/0353098 A1 | 12/2016 | Stein | |
| 2017/0188006 A1 | 6/2017 | Park et al. | |
| 2019/0072771 A1* | 3/2019 | Hall | G01B 5/0014 |

OTHER PUBLICATIONS

English Translation of Taiwanese Office Action dated Feb. 3, 2020 for corresponding TW Application No. 108100491, 5 pages.

* cited by examiner

ACTIVE LCD SHUTTERS FOR VIRTUAL AND AUGMENTED REALITY LOW PERSISTENCE

CROSS REFERENCE TO RELATED APPLICATIONS

This application claims priority to U.S. Provisional Patent Application 62/636,892, entitled "ACTIVE LCD SHUTTERS FOR VIRTUAL REALITY LOW PERSISTENCE" and filed on Mar. 1, 2018, the entirety of which is incorporated by reference herein.

BACKGROUND

Head mounted display (HMD) devices sometimes incorporate a mobile device or display panels and other electronic computing components to create and display various types of content, including virtual reality (VR) content, augmented reality (AR) content, and the like. Some display screens used in VR and AR systems are driven at low persistence, where screen persistence is the percentage of a video frame duration during which pixels of the display screen are actually lit. Other display screens are driven at a higher persistence, where pixels of a current displayed image remain lit and visible until the next image is presented for display.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Different types of display screens often vary in their image persistence, a measure of how long each image sent to a display stays on that display, and such variation can impact a user experience. For example, when an object in an image moves across the image, a user's brain expects it to do so smoothly. With a higher-persistence or full-persistence display (i.e., where each image stays on the display until the next image arrives), the object "jumps" across the screen for each frame update and is motionless for the duration of each frame. These jumps can result in a relatively poor user experience. For example, when halfway between a first frame and a second frame, the user's brain expects to find the object halfway between its position in the first frame and its position in the second frame. However, since the display has not yet been updated the full persistence display, the object is still displayed at its location in the first frame. This mismatch between the predicted position and the actual position of the object causes motion blur.

Generally, lower persistence leads to better motion clarity. However, the mobile devices often employed by HMD systems are not configured to provide a low persistence mode of display. The resulting motion blur can result in significant visual artifacts in VR/AR for these devices, especially with high persistence displays such as liquid crystal displays (LCD) or organic light-emitting diode (OLED) displays. For example, LCD displays commonly use full persistence. The backlight shines through the liquid crystals, which together with polarized filters, color each pixel. The backlight remains on constantly and the liquid crystals remain in the same configuration for the duration of each frame, keeping recorded point samples of objects in a scene on display until the next frame is displayed. That is, when a pixel of the LCD display is addressed, it is loaded with a value and stays at that light output value until it is next addressed. Traditional mobile devices often do not provide low persistence support natively because it reduces total brightness to the eye. Additionally, response time contributes to motion blur as well. For example, in LCD devices, the response time can exceed the duration of one frame.

As further described herein, to extend low persistence support to additional mobile devices, various embodiments include a head-mounted display (HMD) device having one or more active shutters coupled to a synchronization module. The synchronization module includes a first photodiode configured to detect a synchronization signal for controlling operation of the one or more active shutters. The one or more active shutters are configured to alternate between an open state to pass light and a closed state to block light for reducing a duty cycle of a display screen of a mobile device positioned within the HMD device. The synchronization signal provides a timing to block light from the display screen for a display update duration corresponding to a subset of pixels of the display screen. This duty cycle reduction sharpens images from the display screen and decreases perceptible motion blur, thereby providing for lower persistence viewing without requiring any modification to the mobile device itself, as the active shutter optics are integrated into the HMD device housing.

Figure 1:
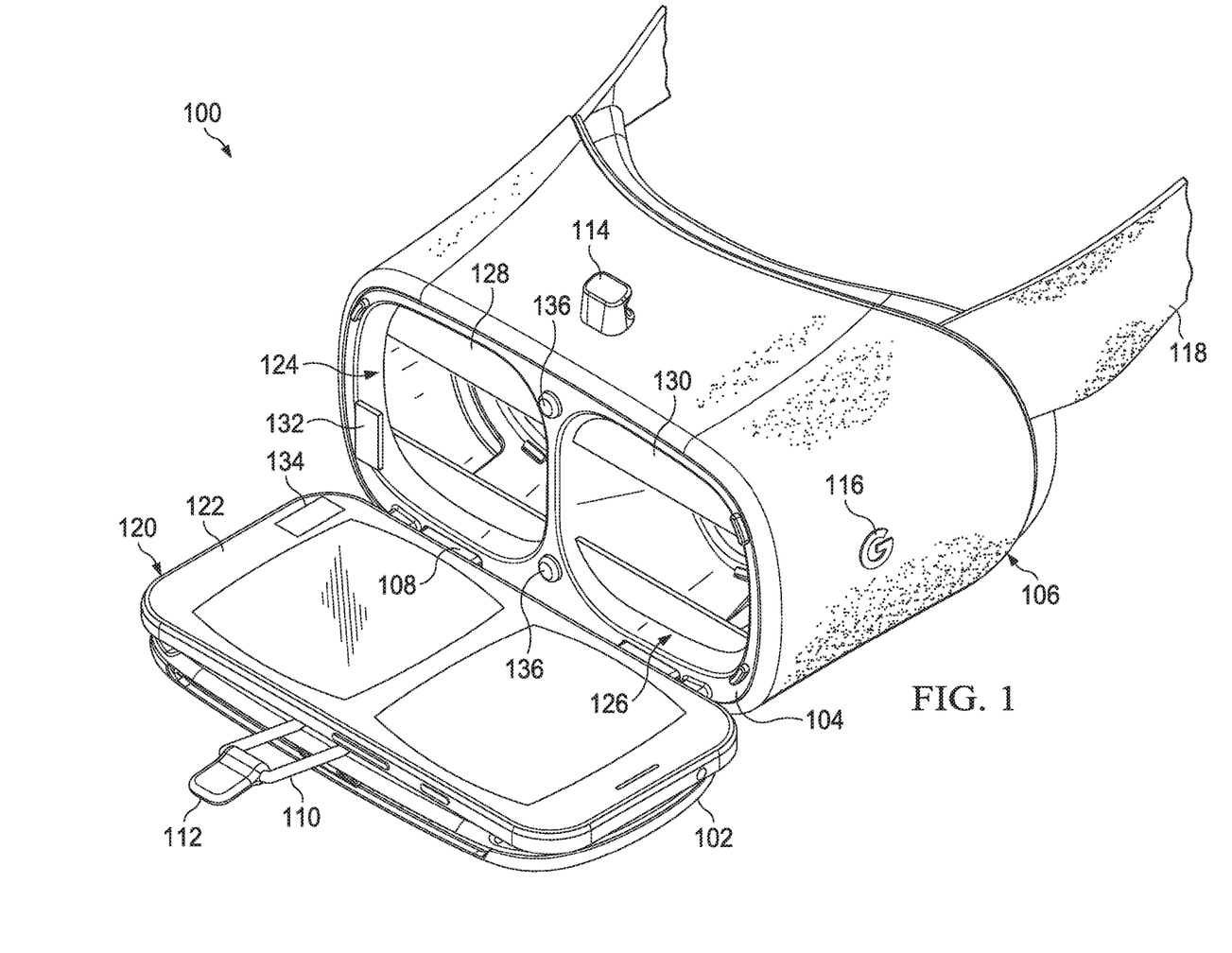
FIG. 1 is a diagram illustrating a perspective view of an HMD device with active shutters in an open configuration in accordance with some embodiments.

FIG. 1 is a diagram illustrating a perspective view of an HMD device 100 with active shutters in an open configuration in accordance with some embodiments. The HMD device 100 includes a HMD door component 102 coupled to a device-facing surface 104 of a HMD housing 106 by hinges 108 and a fastener 110. The fastener 110 includes a tag 112 to facilitate gripping the fastener 110 and looping the fastener over a post or a peg 114 on an outer surface 116 of the HMD housing 106. In another example, a strap may take the place of the fastener 110 and a hook-and-loop fastener (one surface of the fastener on the strap, another surface of the fastener on the outer surface 116) takes the place of the securing mechanism of looping the fastener 110 over the peg 114. The HMD housing 106 is held onto a head of a user by a strap 118.

As illustrated in FIG. 1, a mobile device 120 is positioned on a device-facing surface (not shown) of the HMD door component 102 such that a display screen 122 of the mobile device 120 faces the device-facing surface 104 of the HMD housing 106 when the HMD device is in a closed configuration (e.g., with fastener 110 fastened to the peg 114). For example, the tag 112 of the fastener 110 is placed over the peg 114 to position the HMD door component 102 in a closed position and to exert a force or pressure against the mobile device 120 within the HMD device 100.

The mobile device 120 can include any of a variety of portable electronic devices operated by one or more users, such as head mounted display, a tablet computer, computing-enabled cellular phone (e.g., a "smartphone"), a notebook computer, a personal digital assistant (PDA), and the like. The display screen 122 includes an array of pixels for displaying rendered images. In some embodiments, the display screen 122 operates in accordance with a refresh rate specifying a number of video frames displayed per unit of time and a corresponding frame duration (e.g., for a refresh rate of 100 Hz, 100 frames are displayed per second, and the frame duration is 10 ms). In the depicted example, the mobile device 120 typically is oriented with respect to the user such that eyes of the user face the display screen 122.

Accordingly, for ease of reference, the surface upon which the mobile device 120 is positioned upon in FIG. 1 may also be referred to herein as the "user-facing" surface of the HMD door component 102 and the device-facing surface 104 of the HMD housing 106 may also be referred to herein as the "device-facing" surface as a reflection of this example orientation, although the orientation of these surfaces is not limited by these relational designations. When closed, a user-facing surface of the HMD door component 102 is reversibly mated or coupled to the device-facing surface 104 of the HMD housing 106. A back surface of the mobile device 120 (e.g., surface opposite that of the display screen 122) is placed against the user-facing surface of the HMD door component 102 and a front surface of the mobile device (e.g., the display screen 122) is placed against the device-facing surface 104 of the HMD housing 106.

The HMD device 100 includes various optics disposed within the HMD housing 106 such that the display screen 122 is oriented towards the optics in a direction that is toward a face of the user when the HMD device 100 is worn by the user. The HMD housing 106 is divided into a first or right chamber 124 and a second or left chamber 126. When the HMD door component 102 is closed, the user is able to view a respective portion of the display screen 122 through each of the chambers 124, 126. For example, in various embodiments, each of the chambers 124, 126 includes optics such as one or more lenses (not shown) for presenting imagery to the left and right eyes of the user.

To reduce motion blur, in various embodiments, the HMD device 100 includes one or more active shutters operable to reduce the total frame time (e.g., exposure time of light for each image frame) of light passed to the eyes of the user for perception. As illustrated in FIG. 1, the HMD device 100 includes a first or right active shutter 128 positioned in the right chamber 124 and a second or left active shutter 130 positioned in the left chamber 126 to reduce the duty cycle (e.g., fraction of one period in which a signal is active) of VR video content displayed by the mobile device 120. That is, although the display screen 122 of the mobile device 120 may be a high persistence or full persistence display (e.g., OLED display), the active shutters 128, 130 block some of the light emitted by the display screen 122 in a time-varying sense to reduce illumination time as perceived by the eyes of the user. Reducing the duty cycle of the display screen 122 and thereby reducing the exposure time for each of the user, by closing the right active shutter 128 and the left active shutter 130, provides a sharper image and reduces motion blur at the cost of decreasing the amount of light photons to the eyes of the user.

In some embodiments, the active shutters 128, 130 are implemented with liquid crystal (LC) shutters (also known as LCD shutters). A voltage is applied to the LC shutters to toggle between an open state (in which it is clear or translucent) and a closed state (in which it is opaque to light). For example, LC shutters based on twisted nematic, super-twisted nematic, or pi-cell technology may be used. The LC shutters operate as switchable polarization rotators and selectively let light through or block light depending on its polarization state due to applied voltages. As described herein, the term "open state" refers to the active shutters being generally open (e.g., mostly open) such that the active shutters are transmissive to light but does not necessarily connote that the active shutters are 100% transmissive. Similarly, the term "closed state" refers to the active shutters being generally closed (e.g., mostly closed) such that the active shutters are opaque to light but does not necessarily connote that the active shutters are 100% opaque.

Although described here primarily in the context of LC shutters, those skilled in the art will recognize that various other shutter systems may be used in the HMD device 100 without departing from the scope of this disclosure. For example, in some embodiments, the active shutters 128, 130 may be mechanical or physical shutters, electrophoretic, electro-optic, MEMS, and the like. In other embodiments, ferro-electric LC shutters may be used. The various shutters may have differing sets of driving properties. However, in general, the active shutters 128, 130 may include any shutter technology capable of covering display optics of the HMD device 100 for modulating exposure.

Those skilled in the art will recognize that although the embodiment of FIG. 1 illustrates the right active shutter 128 and the left active shutter 130 as positioned in front of the display optics (i.e., between the mobile device 120 and the display optics), in other embodiments, the right active shutter 128 and the left active shutter 130 are positioned behind the display optics (i.e., between the display optics and the user's eyes) such that light emitted from the display screen 122 first pass through the display optics before passing through or being blocked by the right active shutter 128 and the left active shutter 130.

The display screen 122 of HMD device 100, according to various embodiments, is generally updated on a rolling update basis, in which the display of images is updated one row of pixels at a time. That is, rather than all the image pixels for any given image arriving all at once via a global refresh, every image update is rolled out sequentially down each row. This results in fast moving objects exhibiting horizontal and/or vertical shearing. Thus, the HMD device 100 synchronizes with the rolling update (also referred to herein as "rolling display" or "rolling refresh") and staggers timing of closing and opening the right active shutter 128 and the left active shutter 130 such that the eyes of the user do not see a frame as it is updating. The HMD device 100 includes a photodiode 132 or other light detector that detects a set of synchronization pixels 134 emitted by the display screen 122 for synchronizing the active shutters 128, 130 with the display screen 122 of the mobile device 120. The HMD device 100 also includes two or more touch points 136 protruding from the device-facing surface 104 of the HMD housing 106 such that the two or more touch points 136 are in contact with the display screen 122 of the mobile device 120 when the HMD device 100 is in a closed configuration such that the mobile device 120 is positioned between the HMD door component 102 and the device-facing surface 104 of the HMD housing 106. As described in more detail below, based on the contact position of the two or more touch points 136 with the display screen 122, the HMD device 100 determines an alignment of the mobile device 120 and its associated synchronization pixels 134 relative to the photodiode 132. Additionally, as described in more detail below, based on the set of synchronization pixels 134, the HMD device 100 closes the active shutters 128, 130 at an interval defined by the mobile device's rendering system. By alternating display of the separate left and right images (i.e., stereoscopic image pair), the duty cycle of VR content displayed is reduced, which reduces perceived motion blur during user head movement.

Figure 2:
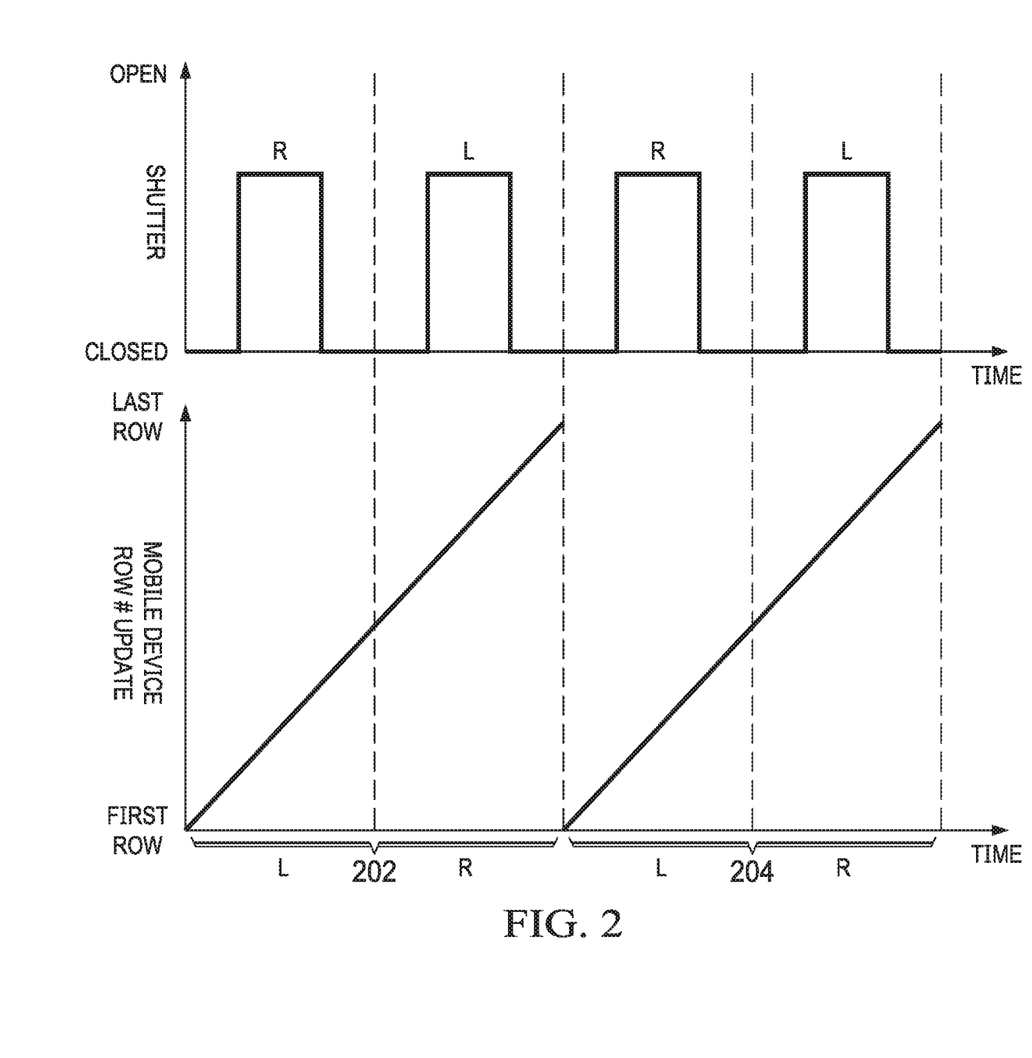
FIG. 2 is a diagram illustrating alternating the opening and closing of active shutters in synchronization with a rolling update of a display screen in accordance with some embodiments.

FIG. 2 is a diagram illustrating alternating the opening and closing of active shutters in synchronization with rolling update of the display screen in accordance with some embodiments. In this example, the display screen updates from left-to-right in a rolling update manner and the timing of opening and closing of the active shutters is staggered such as to not display a previous frame while it is updating. As shown in FIG. 2, as a left image of a first image 202 (e.g., a left image of a stereoscopic image pair) is being updated on a row by row basis, the left shutter (e.g., left active shutter 130 of FIG. 1) is closed such that light from the left image of the first image 202 does not pass through to the eyes of the user while updating. Meanwhile, the right shutter (e.g., right active shutter 128 of FIG. 1) is open such that light of an image prior to the first image 202 passes through and is exposed to the user. After the left image of the first image 202 is updated and a right image of the first image 202 (e.g., a right image of a stereoscopic image pair) begins updating on a row by row basis, the right shutter is closed such that light from the right image of the first image 202 does not pass through to the eyes of the user while updating. Meanwhile, the left shutter is open such that light of the left image of the first image 202 that just finished updating passes through and is exposed to the user.

Subsequently, after the first image 202 has finished updating on the display screen 122, as a left image of a second image 204 is being updated on a row by row basis, the left shutter (e.g., left active shutter 130 of FIG. 1) is closed such that light from the left image of the second image 204 does not pass through to the eyes of the user while updating. Meanwhile, the right shutter (e.g., right active shutter 128 of FIG. 1) is open such that light of the right image of the first image 202 passes through and is exposed to the user. After the left image of the second image 204 is updated and a right image of the second image 204 begins updating on a row by row basis, the right shutter is closed such that light from the right image of the second image 204 does not pass through to the eyes of the user while updating. Meanwhile, the left shutter is open such that light of the left image of the second image 204 that just finished updating passes through and is exposed to the user.

As the left image is being updated, the left shutter is closed as the boundary of the rolling updating travels across the display screen and light from the left portion of the display screen does not reach the user's eyes. After the left image finishes updating, the left shutter is opened, and the left image is exposed to the user for viewing while the right shutter is closed during updating of the right image. In this manner, the HMD device 100 alternatively changes the properties of the right active shutter 128 from translucent to opaque to translucent and the left active shutter 130 from opaque to translucent to opaque.

Figure 3:
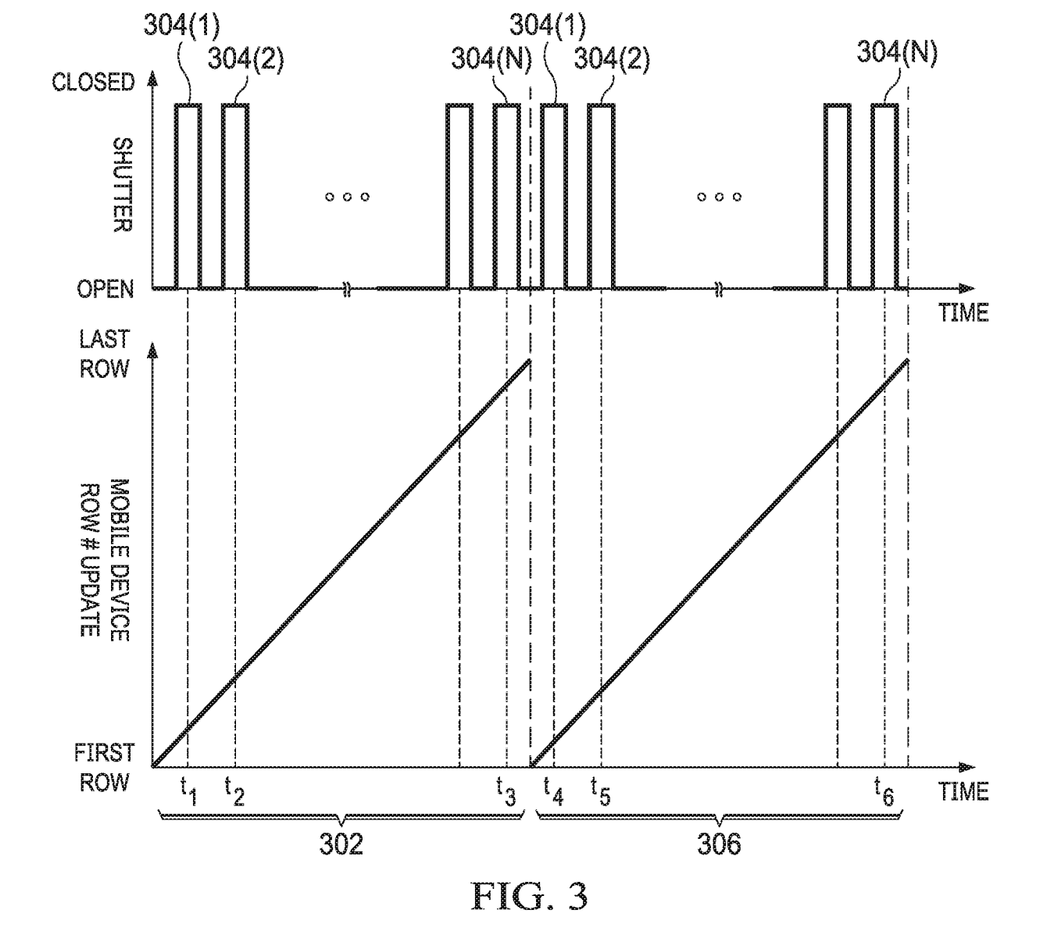
FIG. 3 is a diagram illustrating alternating the opening and closing of rolling active shutters in synchronization with a rolling update of the display screen in accordance with some embodiments.

FIG. 3 is a diagram illustrating alternating the opening and closing of rolling active shutters in synchronization with rolling update of the display screen in accordance with some embodiments. In this example, rather than alternating a pair of active shutters and blocking off the entirety of the left or right image during rolling updates, the HMD device 100 includes an array of shutters that synchronize with the rolling update of the display screen. Rather than blocking the entirety of a left or a right image, such as previously described relative to FIG. 2, the opening and closing of each active shutter of the array of shutters is synchronized to the rolling update of the display screen such that the eyes of the user do not see the particular row (or column) undergoing updating.

As shown in FIG. 3, as a first image 302 is being updated on a row by row basis, one active shutter 304(1) of a plurality of active shutters 304(N) (e.g., N number of active shutters) is closed a time $t_1$ corresponding to a particular one or more rows of pixels of the first image 302 while updating. While the active shutter 304(1) is closed, light from the particular one or more rows of pixels from the first image 302 does not pass through to the eyes of the user. Meanwhile, all other of the plurality of active shutters 304(N) are open at time time $t_1$ such that light from all other rows of pixels of the display screen corresponding to the first image 302 passes through and is exposed to the user. Subsequently, at a time $t_2$ corresponding to a different one or more rows of pixels of the first image 302, a different active shutter 304(2) of the plurality of active shutters 304(N) is closed. Meanwhile, all of the plurality of active shutters 304(N) other than active shutter 304(2) are open at time time $t_2$ such that light from all other rows of pixels of the display screen corresponding to the first image 302 passes through and is exposed to the user. Thus, light from the different one or more rows of pixels corresponding to the active shutter 304(2) does not pass through to the eyes of the user while undergoing update. This rolling update process continues through time $t_3$ until the entirety of the display screen has been updated to display the first image 302.

Subsequently, after the first image 302 has been updated, the second image 306 begins updating at the first row of the display screen. As the second image 306 is being updated on a row by row basis, one active shutter 304(1) of a plurality of active shutters 304(N) (e.g., N number of active shutters) is closed a time $t_4$ corresponding to a particular one or more rows of pixels of the second image 306 while updating. While the active shutter 304(1) is closed, light from the particular one or more rows of pixels from the second image 306 does not pass through to the eyes of the user. Meanwhile, all other of the plurality of active shutters 304(N) are open at time time $t_4$ such that light from all other rows of pixels of the display screen corresponding to the second image 306 passes through and is exposed to the user. Subsequently, at a time $t_5$ corresponding to a different one or more rows of pixels of the second image 306, a different active shutter 304(2) of the plurality of active shutters 304(N) is closed. Meanwhile, all of the plurality of active shutters 304(N) other than active shutter 304(2) are open at time time $t_5$ such that light from all other rows of pixels of the display screen corresponding to the second image 306 passes through and is exposed to the user. Thus, light from the different one or more rows of pixels corresponding to the active shutter 304(2) does not pass through to the eyes of the user while undergoing update. This process continues, following rolling update until the entirety of the display screen has been updated to display the second image 306. In this manner, the plurality of active shutters 304(N) are opened and closed to align with the rolling update of the display screen, which reduces the duty cycle of the display to a lesser extent than the embodiment of FIG. 2.

Those skilled in the art will recognize that although described here in the context of synchronizing active shutters to the rolling updates of phone displays, the duty cycling may also be applied to other display screen dynamics for the purposes of reducing perceived motion blur. For example, in other embodiments, the display screen is a globally updating display in which all pixels update simultaneously. In such embodiments, there is no need for synchronizing the opening and closing of active shutters to match the rolling update. Accordingly, the HMD device includes a single global shutter that is operable to reduce the duty cycle by closing the single global for a portion of the display time of each image frame. Alternatively, one or more active shutters such as described in FIGS. 2-3 may be used. However, instead of alternating the opening and closing of the active shutters, all of the shutters are closed for a portion of the display time of each image frame (i.e., multiple active shutters effectively operating as a single global shutter).

Additionally, those skilled in the art will recognize that although described here in the context of synchronizing active shutters to the rolling updates of phone displays based on a left-to-right rolling update of rows, the display screen can be configured and activated in a rolling manner as columns, rows, or both. In various embodiments, each individual mobile device includes its own unique dynamics on how the display screen gets updated. For example, in the embodiment discussed above, the rolling update for the display screen is performed from left to right. In other embodiments, the rolling update is performed from right to left, and further may be dependent upon the orientation that the user positions the mobile device within the HMD device 100. Additionally, different mobile devices include display screens with different frame rates, different timings or delays between image updates, timing peculiarities between manufacturers, and the like.

Accordingly, as previously illustrated in FIG. 1, the HMD device 100 includes a photodiode 132 or other light detector that detects a corresponding set of synchronization pixels 134 emitted by the display screen 122 for synchronizing the active shutters 128, 130 with the display screen 122 of the mobile device 120. Ideally, in context of FIG. 2, at the same time the left shutter is closed while the left image is updating, the right shutter is open and displaying the right image; and at the same time the right shutter is closed while the right image is updating, the left shutter is open and displaying the left image.

Figure 4:
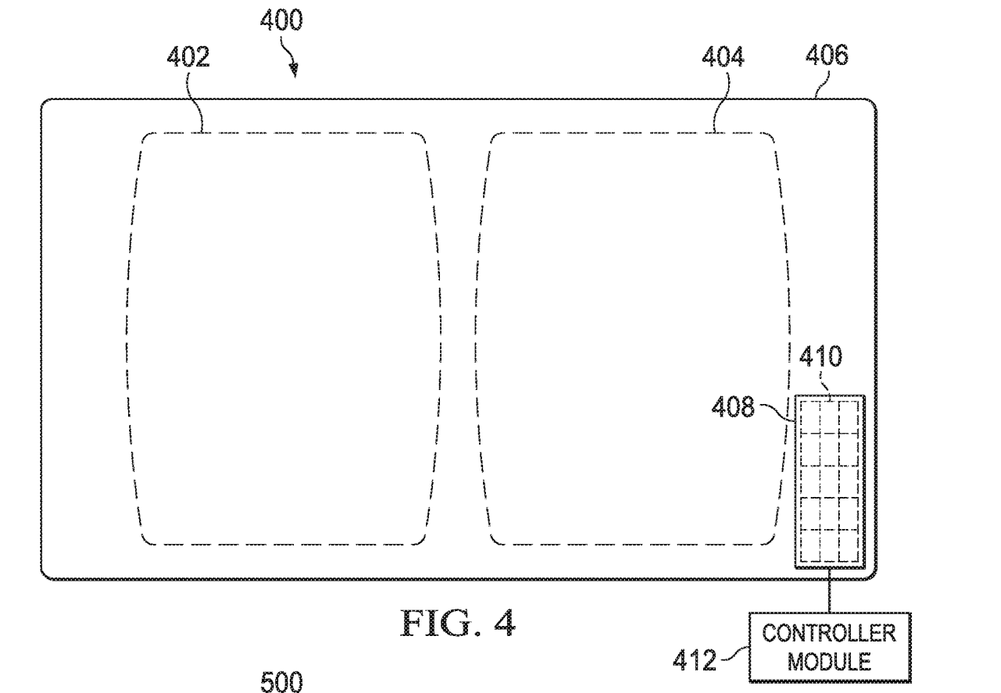
FIG. 4 is a diagram illustrating active shutter synchronization in accordance with some embodiments.

FIG. 4 is a diagram illustrating active shutter synchronization in accordance with some embodiments. The display-screen-facing view 400 of FIG. 4 illustrates a left image 402 and a right image 404 of a stereoscopic image pair presented for display on display screen 406 (such as the display screen 122 of FIG. 1). In various embodiments, the active shutters described herein are connected to a synchronization system including a visible light spectrum diode 408 (such as the photodiode 132 of FIG. 1) of a HMD device which is positioned to detect a section of synchronization pixels 410 (such as the synchronization pixels 134 of FIG. 1) presented for display in a corner of the display screen 406.

The synchronization pixels 410 are presented during the display of VR content, such as the left image 402 and the right image 404, to provide synchronization data to a controller module 412 coupled to the active shutters without requiring a wired connection between the mobile device and the HMD device. In one embodiment, the synchronization pixels 410 provide a pulse sequence that identifies the particular model of the mobile device positioned within the HMD device. Based on the model identification information provided by the synchronization pixels 410, the controller module 412 determines the unique update dynamics for that particular model of the mobile device, such as via a lookup table containing measured update dynamics and associated active shutter operation parameters for various mobile device models. It will be appreciated that the synchronization pixels can be encoded or spread over multiple display frames to synchronize the active shutters to the display screen 406. Additionally, the synchronization pixels 410 may be presented as any of a grayscale pulse sequence, full color pixel display, and the like.

Those skilled in the art will recognize that although described here in the context of presenting the synchronization pixels 410 for display at a corner of the display screen 406, the synchronization pixels 410 may be presented for display at any portion of the display screen 406 detectable by the associated visible light spectrum diode 408. For example, in other embodiments, the synchronization pixels 410 are displayed at the center of the display screen 406 in between the stereoscopic left image 402 and right image 404. Additionally, although illustrated as a rectangular-shaped array of pixels, the synchronization pixels 410 may be presented for display as pixels of any size, shape, or configuration (e.g., as a thin bar, spherical shape, and the like). Generally, any pixels not being used to display VR content may be used for the display of synchronization pixels 410.

A system clock of the controller module 412 will be unlike to match exactly with a system clock of the mobile device displaying VR content, as they will likely operate at slightly different frequencies relative to each other. Accordingly, even with knowledge of the operating frequencies of the mobile device and the controller module 412 of the HMD device, synchronization between opening and closing of the active shutters relative to the display updates of the display screen 406 can drift from each other over time. The synchronization pixels 410 provide the data that allows the controller module 412 to resync any accumulated phase errors over a period of time. For example, in one embodiment, the synchronization pixels 410 resyncs the controller module 412 to the display screen 406 every four seconds. However, in various other embodiments, the synchronization pixels 410 resyncs the controller module 412 to the display screen 406 at a shorter interval or at a longer interval, depending on how close the system clock of the controller module 412 and the system clock of the mobile device are to each other.

In operation, after the mobile device is positioned in the HMD device (such as illustrated in FIG. 1), the display screen 406 transmits the synchronization pixels 410 as a synchronization signal at a corner portion of the screen while rendering VR content output at other portions of the display screen 406. The controller module 412 signals the active shutters to close the active shutters at an interval defined to be in synchronization with the mobile device's rendering system, as previously described relative to FIG. 2. Accordingly, the mobile device's rendering system and the controller module 412, via timing data provided by the synchronization pixels 410, closes the active shutters for at least the duration of the image update period (e.g., LCD liquid crystal transition period for LCD displays) before opening again. The alternating of left and right active shutter close timings to coincide with scanline racing by the mobile device (e.g., rolling update) reduces the duty cycle of the display screen 406 and reduces apparent visible latency to reduce perception of motion blur, particularly with higher-persistence displays.

In other embodiments, rather than providing synchronization data optically via the synchronization pixels 410 and the associated visible light spectrum diode 408 as described above, the HMD device includes a physical, wired connection between the mobile device and the controller module 412. The physical tethering of the controller module 412 of the active shutter system to the mobile device allows for the controller module 412 to communicate with and receive synchronization data, such as data regarding the update dynamics (e.g., vertical sync (Vsync) data), directly from the mobile device without requiring the use of synchronization pixels 410.

Figure 5:
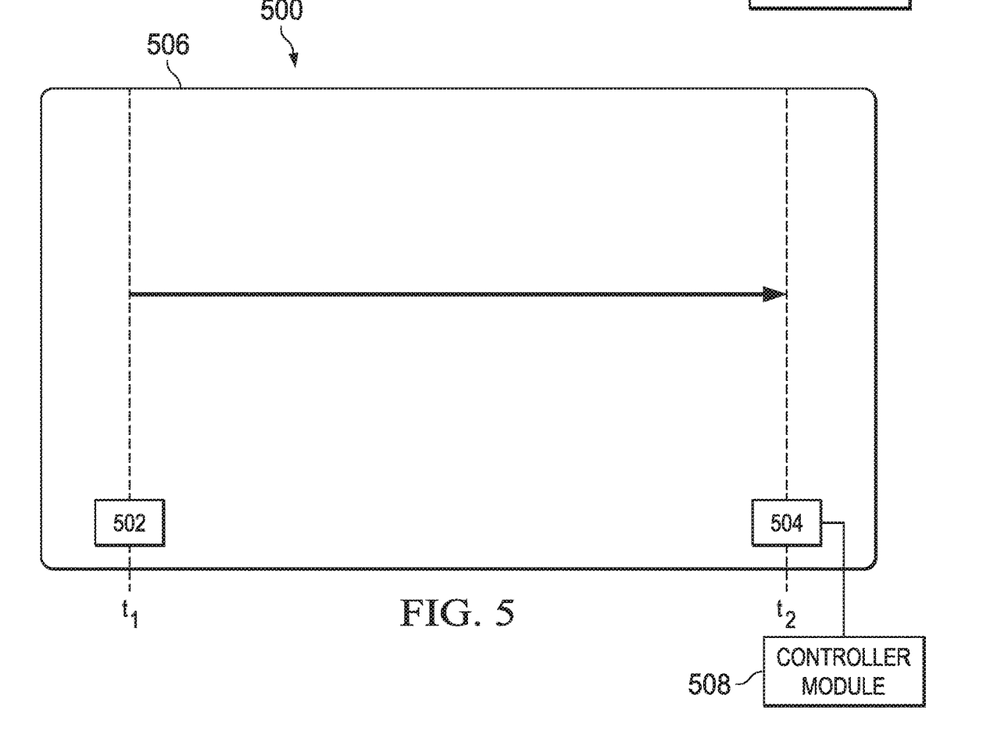
FIG. 5 is a diagram illustrating active shutter synchronization based on detection of display screen update dynamics in accordance with some embodiments.

In another embodiment, FIG. 5 is a diagram illustrating active shutter synchronization based on detection of display screen update dynamics in accordance with some embodiments. The display-screen-facing view 500 of FIG. 5 illustrates a synchronization system include a first visible light spectrum diode 502 and a second visible light spectrum diode 504 of the HMD device positioned to be facing opposing sides of the display screen 506. Thus, rather than a single photodiode positioned in the HMD device to be facing the display screen (as illustrated in FIGS. 1 and 4), the example of FIG. 5 includes a pair of photodiodes positioned in the HMD device.

The pair of visible light spectrum diodes 502, 504 do not receive any encoded synchronization data via synchronization pixels displayed on the display screen 506. Rather, the visible light spectrum diodes 502, 504 perform direct measurement of rolling shutter direction and timing to control the phase delay of the active shutters of the HMD device. For example, as illustrated in FIG. 5, the first visible light spectrum diode 502 detects a display update of pixels at a first time $t_1$ and the second visible light spectrum diode 504 detects a display update of pixels at a first time $t_2$. Based on this information, a controller module 508 determines that the rolling update of the display screen 506 proceeds in a left to right manner. Additionally, the controller module 508 determines various display update dynamics associated for the display screen. For example, based on a detection of the next display update by the first visible light spectrum diode 502, the controller module 508 determines a delay between image frame updates, such as due to loading of display buffers between frames. As another example, based on repeated detection of display updates by the first and second visible light spectrum diodes 502, 504 across multiple frames, the controller module 508 determines a frame rate of the display screen 506.

In this manner, the controller module 508 is able to obtain data points necessary to determine the specific update dynamics for the mobile device currently positioned within the HMD device without requiring the mobile device to display synchronization pixels (such as described relative to FIG. 4) or a user having to manually provide data regarding phone models. Additionally, this photodiode-based detection of display update parameters allows for an easier user experience. In addition to eliminating the need for the user to manually input mobile device identification information, the user does not need to be concerned with orientation of inserting the mobile device. For example, instead of the orientation illustrated in FIG. 5, if the user positions the mobile device into the HMD device in an inverted manner, the controller module 508 will determine that the rolling update of the display screen 506 proceeds in a right to left manner and synchronize active shutters to the display screen 506 accordingly.

Figure 6:
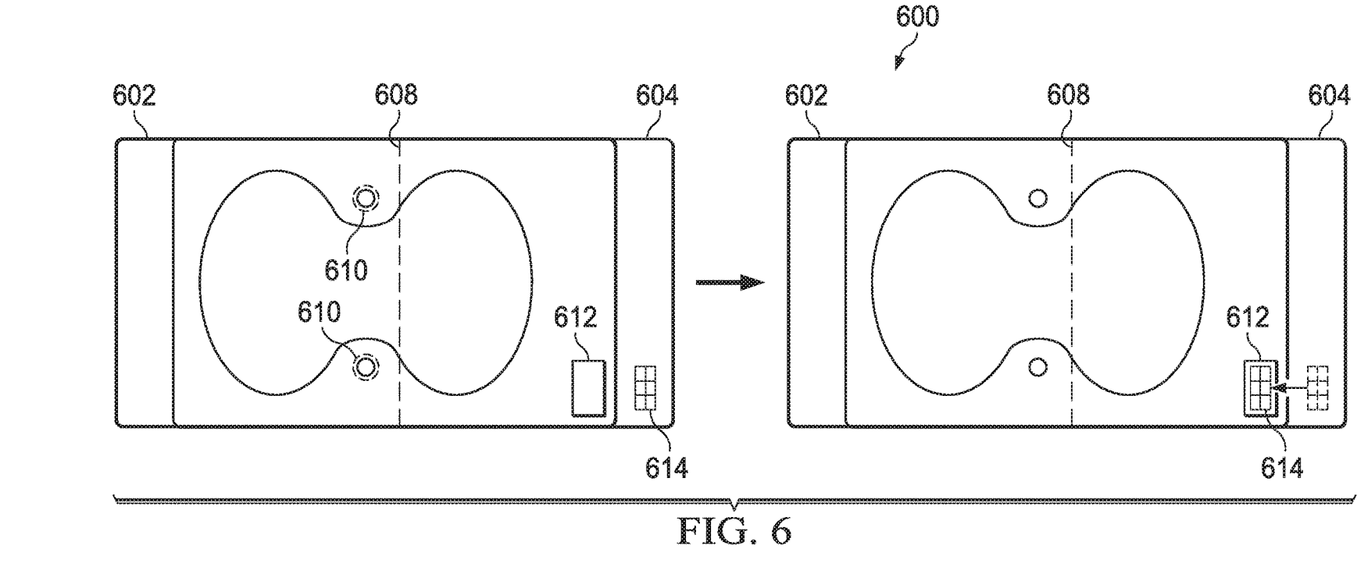
FIG. 6 is a diagram illustrating alignment of the display position of synchronization pixels to a corresponding photodiode detector in accordance with some embodiments.

FIG. 6 is a diagram illustrating alignment of the display position of synchronization pixels to a corresponding photodiode detector in accordance with some embodiments. The display-screen-facing view 600 of FIG. 6 illustrates a misalignment of the device-facing surface 602 of the HMD housing (such as device-facing surface 104 of FIG. 1) relative to the display screen 604 of the mobile device. Thus, the touch points 606 (such as touch points 136 of FIG. 1) are not in contact with the center 608 of the display screen 604 as would be the case if the mobile device were centered within the HMD device, such as illustrated in FIG. 1, such as to be aligned with the device-facing surface 602. For example, based on contact at contact positions 610 on the display screen 604 of the mobile device, the mobile device identifies the misalignment and determines that the photodiode 612 of the HMD housing will not be able to detect the synchronization pixels 614 displayed by the display screen 604. The orientation of the display screen 604 relative to the HMD housing, such as by knowledge of the contact positions 610, is used to update rendering of imagery on the display screen 604 such that the display position of the synchronization pixels 614 aligns with the photodiode. This shifting of the display position of the synchronization pixels 614 reduces the preciseness with which the user needs when inserting the mobile device 120 into the HMD device 100 for VR content viewing.

Figure 7:
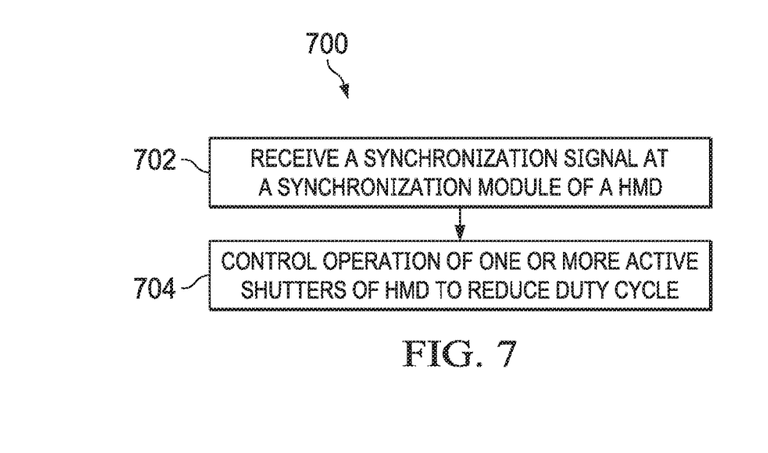
FIG. 7 is a flow diagram illustrating a method of reducing duty cycle of displayed VR content in accordance with some embodiments.

FIG. 7 is a flow diagram illustrating a method 700 of reducing duty cycle of displayed VR content in accordance with some embodiments. The method 700 begins at block 702 with receiving, at a synchronization module, a synchronization signal including a set of display screen update dynamics data. In some embodiments, receiving the synchronization signal includes detecting, at a first photodiode, a set of synchronization pixels displayed by a display screen of a mobile device. For example, as discussed above in more detail relative to FIG. 4, a section of synchronization pixels 410 are presented for display in a corner of the display screen 406. The synchronization pixels 410 are presented during the display of VR content. In one embodiment, the synchronization pixels 410 provide a pulse sequence that identifies the particular model of the mobile device positioned within the HMD device. Based on the model identification information provided by the synchronization pixels 410, the controller module 412 determines the unique update dynamics for that particular model of the mobile device, such as via a lookup table containing measured update dynamics and associated active shutter operation parameters for various mobile device models, thereby providing display screen update dynamics data to a controller module 412 coupled to the active shutters without requiring a wired connection between the mobile device and the HMD device.

In other embodiments, receiving the synchronization signal includes detecting, at a first photodiode, a first timing of a display update to present a first image and detecting, at a second photodiode, a second timing of a display update to present the first image. For example, as discussed above in more detail relative to FIG. 5, a pair of photodiodes perform direct measurement of rolling shutter direction and timing to control the phase delay of the active shutters of the HMD device. For example, as illustrated in FIG. 5, the first visible light spectrum diode 502 detects a display update of pixels at a first time $t_1$ and the second visible light spectrum diode 504 detects a display update of pixels at a first time $t_2$. Based on this information, a controller module 508 determines that the rolling update direction of the display screen 506 proceeds in a left to right manner. Additionally, the controller module 508 determines various display update dynamics associated for the display screen. For example, based on a detection of the next display update by the first visible light spectrum diode 502, the controller module 508 determines a delay between image frame updates, such as due to loading of display buffers between frames. As another example, based on repeated detection of display updates by the first and second visible light spectrum diodes 502, 504 across multiple frames, the controller module 508 determines a frame rate of the display screen 506. In this manner, the controller module 508 is able to obtain data points necessary to determine the specific update dynamics for the mobile device currently positioned within the HMD device without requiring the mobile device to display synchronization pixels.

At block 704, the method 700 continues with controlling operations of one or more active shutters based on the received set of display screen update dynamics data of block 702 to reduce a duty cycle of a display screen. In one embodiment, as described above in more detail relative to FIG. 2, controlling operations of one or more active shutters includes synchronizing an alternating of the one or more active shutters between an open state to pass light emitted from the display screen and a closed state to block light emitted from the display screen and match a rolling update of the display screen. This includes signaling a first active shutter of the one or more active shutters to enter the closed state while a first portion of the display screen associated with the first active shutter is updating to present a first image and signaling a second active shutter of the one or more active shutters to enter the closed state while a second portion of the display screen associated with the first active shutter is updating to present the first image. Additionally, the first active shutter is signaled to enter the open state while the second portion of the display screen associated with the second active shutter is updating to present the first image. Subsequently, while the first portion of the display screen associated with the first active shutter is updating to present a second image, the first active shutter is signaled to enter the closed state and the second active shutter is signaled to enter the open state, thereby alternating their openings and closings.

For example, as shown in FIG. 2, as a left image of a first image 202 is being updated on a row by row basis, the left shutter is closed such that light from the left image of the first image 202 does not pass through to the eyes of the user while updating. Meanwhile, the right shutter is open such that light of an image prior to the first image 202 passes through and is exposed to the user. After the left image of the first image 202 is updated and a right image of the first image 202 begins updating on a row by row basis, the right shutter is closed such that light from the right image of the first image 202 does not pass through to the eyes of the user while updating. Meanwhile, the left shutter is open such that light of the left image of the first image 202 that just finished updating passes through and is exposed to the user.

Subsequently, after the first image 202 has finished updating on the display screen 122, as a left image of a second image 204 is being updated on a row by row basis, the left shutter is closed such that light from the left image of the second image 204 does not pass through to the eyes of the user while updating. Meanwhile, the right shutter is open such that light of the right image of the first image 202 passes through and is exposed to the user. After the left image of the second image 204 is updated and a right image of the second image 204 begins updating on a row by row basis, the right shutter is closed such that light from the right image of the second image 204 does not pass through to the eyes of the user while updating. Meanwhile, the left shutter is open such that light of the left image of the second image 204 that just finished updating passes through and is exposed to the user.

In another embodiment, such as described above in more detail relative to FIG. 3, controlling operations of one or more active shutters at block 704 includes alternating the opening and closing of rolling active shutters in synchronization with rolling update of the display screen. Rather than blocking the entirety of a left or a right image, the opening and closing of each active shutter of the array of shutters is synchronized to the rolling update of the display screen such that the eyes of the user do not see the particular row (or column) undergoing updating. As shown in FIG. 3, as a first image 302 is being updated on a row by row basis, one active shutter 304(1) of a plurality of active shutters 304(N) (e.g., N number of active shutters) is closed a time $t_1$ corresponding to a particular one or more rows of pixels of the first image 302 while updating. While the active shutter 304(1) is closed, light from the particular one or more rows of pixels from the first image 302 does not pass through to the eyes of the user. Meanwhile, all other of the plurality of active shutters 304(N) are open at time time $t_1$ such that light from all other rows of pixels of the display screen corresponding to the first image 302 passes through and is exposed to the user. Subsequently, at a time $t_2$ corresponding to a different one or more rows of pixels of the first image 302, a different active shutter 304(2) of the plurality of active shutters 304(N) is closed. Meanwhile, all of the plurality of active shutters 304(N) other than active shutter 304(2) are open at time time $t_2$ such that light from all other rows of pixels of the display screen corresponding to the first image 302 passes through and is exposed to the user. Thus, light from the different one or more rows of pixels corresponding to the active shutter 304(2) does not pass through to the eyes of the user while undergoing update. This rolling update process continues through time $t_3$ until the entirety of the display screen has been updated to display the first image 302.

In other embodiments, the response time of sync pixels are extrapolated directly from the photodiode signal, which is sampling at very high rates (e.g., ~kHz or higher). This allows more precise timing as to where the end of the frame is for any given mobile device. This is particularly relevant to LCD display devices due to the slow response times.

The systems and methods described here, in various embodiments, provides for a VR viewing system in which a mobile device having a graphics rendering system is positioned within a HMD device (such as a drop-in VR viewer). The HMD device includes active shutters connected to a synchronization system including a visible light spectrum diode which is placed to read a section of pixels in a corner of a phone screen. The display screen of the mobile device transmits a synchronization signal in the corner of the display screen in the form of synchronization pixels while displaying VR distorted output on the rest of the display screen. By closing the active shutters of the HMD device at intervals defined by the mobile device's rendering system and keeping the shutters closed for the duration of a display image's update period, the appearance of motion blur during user head movement is reduced, thereby providing a more responsive and improved visual experience to the user.

In some embodiments, the systems described herein include shutter optics and/or shutter control logic to enable a three-dimensional view of image data rendered on the display screen of the mobile when viewed through the optics of the HMD housing. For example, in various embodiment, a system for rendering virtual reality content is provided that includes shutter optics integrated in the housing. The display optics are oriented on an internal side of the housing that is configured for orientation toward eyes of the user when the housing is attached to the head of the user. In one example, a screen of the mobile device is oriented toward the display optics of the housing. The smartphone has a data connection with the holder to enable data communication between electronics of the housing and electronics of the smartphone. Shutter control logic is interfaced with the electronics of the housing. Optics control logic is interfaced with the shutter optics. A processor is configured to interface with the shutter control logic and the optics control logic. In some implementations, the system also includes a device interface (wired or wireless) for connecting the smartphone to the housing.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the elements described above in the general description are required, that a portion of a specific example device may not be required, and that one or more further elements may be included in addition to those described. Still further, the order in which the features or components appear in the examples and figures described herein are just some of many ways that the features and components may be combined to create a device as described generally herein. The concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus, comprising: a head-mounted display (HMD) device including one or more active shutters coupled to a synchronization module, wherein the synchronization module includes a first photodiode configured to detect a synchronization signal, and further wherein the synchronization module synchronizes, based on the detected synchronization signal, operation of the one or more active shutters, wherein the first photodiode is positioned to detect the synchronization signal as a set of synchronization pixels displayed by the display screen.

2. The apparatus of claim 1, wherein the one or more active shutters are configured to reduce a duty cycle of video content displayed on the display screen of a mobile device positioned within the HMD device.

3. The apparatus of claim 2, wherein the one or more active shutters comprises a pair of LCD shutters that alternate, based on the detected synchronization signal, between an open state to pass light and a closed state to block light, and wherein a first LCD shutter of the pair of LCD shutters is in the open state while a second LCD shutter of the pair of LCD shutters is in the closed state.

4. The apparatus of claim 2, wherein the one or more active shutters comprises a plurality of LCD shutters, and wherein each of the plurality of LCD shutters is configured to block light based on the synchronization signal for a display update duration corresponding to a subset of pixels of the display screen.

5. The apparatus of claim 2, further comprising a second photodiode, and wherein the first photodiode and the second photodiode are positioned within the HID device to detect pixels displayed at opposing sides of the display screen of the mobile device.

6. The apparatus of claim 5, wherein the first photodiode and the second photodiode are positioned to detect the synchronization signal based on a timing difference between a display update to an image frame.

7. A head-mounted display system, comprising: one or more active shutters that each alternate between an open state to pass light and a closed state to block light; and a synchronization module coupled to the one or more active shutters, wherein the synchronization module includes a first photodiode configured to detect a synchronization signal, and further wherein the synchronization module controls, based on the detected synchronization signal, operation of the one or more active shutters, wherein the synchronization signal is emitted only from a predefined portion of a display screen to synchronize the one or more active shutters, and wherein the first photodiode is positioned to detect the synchronization signal as a set of synchronization pixels displayed by a mobile device positioned for display within the head-mounted display system.

8. The head-mounted display system of claim 7, wherein one or more active shutters comprises a pair of LCD shutters, and further wherein a first LCD shutter of the pair of LCD shutters is in the open state while a second LCD shutter of the pair of LCD shutters is in the closed state.

9. The head-mounted display system of claim 8, wherein the one or more active shutters comprises a plurality of LCD shutters, and wherein each of the plurality of LCD shutters is configured to block light based on the synchronization signal for a display update duration corresponding to a subset of pixels of a—the display screen of a mobile device positioned for display within the head-mounted display system.

10. The head-mounted display system of claim 7, further comprising a second photodiode, and wherein the first photodiode and the second photodiode are positioned to detect pixels displayed at opposing sides of a—the display screen of a mobile device positioned for display within the head-mounted display system.

11. The head-mounted display system of claim 10, wherein the first photodiode and the second photodiode are positioned to detect the synchronization signal based on a timing difference between a display update to an image frame.

12. A method, comprising: detecting, at a first photodiode of a synchronization module, a synchronization signal comprising encoded synchronization data; and controlling, based on the synchronization signal, operation of one or more active shutters based on the detected synchronization signal comprising the encoded synchronization data, wherein the first photodiode is positioned to detect the synchronization signal as a set of synchronization pixels displayed by a display screen.

13. The method of claim 12, wherein the operation of the one or more active shutters is controlled to reduce a duty cycle of video content of the display screen.

14. The method of claim 12, wherein controlling operation of one or more active shutters comprises: synchronizing an alternating of each of the one or more active shutters between an open state to pass light emitted from the display screen and a closed state to block light emitted from the display screen, wherein synchronizing the alternating includes matching a rolling update of the display screen.

15. The method of claim 14, further comprising: signaling a first active shutter of the one or more active shutters to enter the closed state while a first portion of the display screen associated with the first active shutter is updating to present a first image; and signaling a second active shutter of the one or more active shutters to enter the closed state while a second portion of the display screen associated with the first active shutter is updating to present the first image.

16. The method of claim 15, further comprising: signaling the first active shutter to enter the open state while the second portion of the display screen associated with the second active shutter is updating to present the first image.

17. The method of claim 16, further comprising: signaling the first active shutter to enter the closed state while the first portion of the display screen associated with the first active shutter is updating to present a second image; and signaling the second active shutter to enter the open state while the first portion of the display screen associated with the first active shutter is updating to present the second image.

18. The method of claim 12, further comprising: detecting, at the first photodiode, a first timing of the display update to present a first image; detecting, at a second photodiode, a second timing of the display update to present the first image; and determining a rolling update direction of the display update based on the first timing and the second timing.

* * * * *

UNITED STATES PATENT AND TRADEMARK OFFICE
CERTIFICATE OF CORRECTION

PATENT NO. : 10,827,164 B2
APPLICATION NO. : 16/144025
DATED : November 3, 2020
INVENTOR(S) : John D. Perreault et al.

Page 1 of 1

It is certified that error appears in the above-identified patent and that said Letters Patent is hereby corrected as shown below:

In the Claims

At Column 14 Line 55, please correct "HID" to be --HMD--

At Column 15 Line 21, please delete "a-"

At Column 15 Line 27, please delete "a-"

Signed and Sealed this
Seventh Day of March, 2023

Katherine Kelly Vidal
*Director of the United States Patent and Trademark Office*